(12) United States Patent
Sakurai et al.

(10) Patent No.: US 7,412,926 B2
(45) Date of Patent: Aug. 19, 2008

(54) IMPRINT APPARATUS AND IMPRINT METHOD

(75) Inventors: Masatoshi Sakurai, Tokyo (JP); Ryouichi Takahashi, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 528 days.

(21) Appl. No.: 11/085,533

(22) Filed: Mar. 22, 2005

(65) Prior Publication Data

US 2006/0065143 A1 Mar. 30, 2006

(30) Foreign Application Priority Data

Sep. 30, 2004 (JP) .............................. 2004-287610

(51) Int. Cl.
*B41F 33/00* (2006.01)
*G11B 5/82* (2006.01)
(52) U.S. Cl. ..................... 101/368; 101/483; 101/463.1
(58) Field of Classification Search ................. 101/368, 101/3.1, 32, 463.1, 483, 489
See application file for complete search history.

(56) References Cited

U.S. PATENT DOCUMENTS 6,748,865 B2 6/2004 Sakurai et al.
6,829,988 B2 * 12/2004 George et al. ................. 101/17

FOREIGN PATENT DOCUMENTS

| JP | 2-27539 | 1/1990 |
|---|---|---|
| JP | 2-128337 | 5/1990 |
| JP | 2-185743 | 7/1990 |
| JP | 2000-246810 | 9/2000 |
| JP | 2003-77867 | 3/2003 |
| JP | 2003-157520 | 5/2003 |
| JP | 2003-332211 | 11/2003 |

OTHER PUBLICATIONS www.dictionary.com; no date.*
U.S. Appl. No. 11/085,533, filed Mar. 22, 2005, Sakurai et al.
U.S. Appl. No. 11/192,048, filed Jul. 29, 2005, Okino et al.

* cited by examiner

*Primary Examiner*—Daniel J. Colilla
*Assistant Examiner*—M. L. Ferguson-Samreth
(74) *Attorney, Agent, or Firm*—Oblon, Spivak, McClelland, Maier & Neustadt, P.C.

(57) ABSTRACT

It is possible to perform even pattern transfer with a high throughput. An imprint apparatus includes: a first press plate having a first press face on which a substrate to be transferred; a second press plate having a second press face opposed to the first press face, which is arranged such that the second press face presses a face of an imprint stamper which is opposed from a face thereof on which a concave and convex pattern is formed; a pressure applying unit which applies a pressure on a face of the second press plate which is opposed from the second press face; a first supporting member which supports a face of the first press plate which is opposed from the first press face and has a section equal to or smaller than a bottom face of the substrate in size; and a frame structure which has a second supporting member supporting the first supporting member, a third supporting member supporting the pressure applying unit, and coupling members coupling respective both ends of the second supporting member and the third supporting member.

17 Claims, 13 Drawing Sheets

IMPRINT APPARATUS AND IMPRINT METHOD

CROSS-REFERENCE TO RELATED APPLICATION

This application is based upon and claims the benefit of priority from prior Japanese Patent Application No. 2004-287610 filed on Sep. 30, 2004 in Japan, the entire contents of which are incorporated herein by reference.

BACKGROUND OF THE INVENTION

1. Field of the Invention

The present invention relates to an imprint apparatus and an imprint method.

2. Related Art

According to dramatic improvement in function of an information or data processing equipment such as a personal computer, an amount of information or data to be handled by a user is significantly increasing. Under such a condition, expectations are raised for an information or data recording/reproducing apparatus with a significantly high recording density and a semiconductor device with a significantly high integration degree as compared with conventional ones.

In order to improve the recording density, a further fine working technique is required. It is possible to perform a fine working on a large area at a time in a conventional lithography technique using an exposure process. However, since such a technique does not have a resolution with wavelength of light or less, it is difficult to produce a fine structure having a size of, for example 200 nm or less. As a technique for forming such a fine structure of 200 nm or less, there are approaches such as an electron beam lithography, a converging ion beam lithography. However, these approaches include such a problem as reduction in throughput.

As a approach for producing a fine structure having a size of wavelength of light or less, there is "NANO-IMPRINT LITHOGRAPHY (NIL) technique" described in U.S. Pat. No. 5,772,905. The nano-imprint lithography technique is a technique for pressing a stamper on which a fine concave and convex pattern is formed in advance by an electron beam lithography or the like on a substrate applied with resist to transfer the concave and convex pattern on a resist layer which is applied on the substrate. A time required for one time processing in the technique can be considerably reduced on, for example, an area of one square inch or more, as compared with the electron beam lithography technique or the converging ion beam lithography.

On the other hand, in recent magnetic recording apparatus, a magnetic disc apparatus, and a hard disc drive apparatus, it is necessary to increase a recording density in a magnetic recording medium in order to meet a demand for increase in a storage volume. However, according to increase in recording density, such a problem is arising that magnetic information recorded by a magnetic recording/reproducing head moving relative to a recording medium influence recording on a track adjacent to the magnetic information. Such a problem can be solved by utilizing a patterning technique separating magnetic materials in adjacent tracks physically (for example, see U.S. Pat. No. 5,723,033).

As the patterning technique for separating magnetic materials on a surface of the magnetic recording medium physically, the above nano-imprint method is effective. When the nano-imprint is used for patterning the magnetic materials on the magnetic recording medium, it is preferable that the imprint is performed at the room temperature and at the atmospheric pressure without performing heating or pressure reducing which requires time for increasing accuracy of pattern transfer at an imprint time and elevating a production efficiency.

Since it is necessary to transfer concave and convex on a resist layer at the room temperature for performing imprint without accompanying heating, it is necessary to make a press pressure higher than that in the imprint process accompanying heating. For example, pressure of at least 100 MPa is required in order to transfer convexconcave on a resist layer of a novolac type commercially available.

On the other hand, a size of a target magnetic recording medium has a doughnut shape with, for example, a diameter of 2.5 inches having a hole with an inner diameter of 20 mm, and a pressure of 30 t is required in order to apply pressure of 100 MPa on a whole face of the magnetic recording medium.

A conventional imprint apparatus is provided with a first press plate having a first press face on which a portion to be pressed including a substrate and an imprint stamper is placed, a pressure applying unit having a shaft and a shaft driving unit for driving the shaft, a second press plate which is connected to a distal end of the shaft and has a second press face opposed to the first press face, where the second press face presses the portion to be pressed placed on the first press face, when the shaft is driven by the shaft driving unit, a first supporting portion on which the first press plate is directly supported and which supports the first press plate, a second supporting portion which supports the pressure applying unit, and a frame structure having a connecting member which connects the first supporting portion and the second supporting portion. As material for the shaft, the first and second plates, and the frame structure, steel or stainless steel which has been subjected to heat treatment is generally used.

The imprint apparatus performs imprint in a state that the portion to be pressed where the imprint stamper and the substrate are opposed to each other is sandwiched between the first press face and the second press face. However, for example, when pressure is applied by a pressure applying unit in the state that the stamper and the substrate are sandwiched between the first press face and the second press face, a pressurizing force of the shaft which presses the portion to be pressed via the second press plate and a reaction force of the frame structure which presses back the portion to be pressed via the first press plate as an reaction to the pressurizing occur. Since acting points of the pressurizing force and the reaction force are different from each other, a structural member between the two acting points deforms.

The pressure acting on the substrate and the stamper becomes uneven within a substrate face due to deformation of the structure and a targeted concave and convex transfer can not be achieved evenly on the whole surface of the substrate, which results in defective transfer.

The defective transfer on the substrate surface occurring due to deformation of the structure causes a pressure concentration on an outer periphery of the substrate and pressure shortage on a central portion thereof.

When an imprint process is performed on a plurality of substrates by a single press working, such a method is effective that the plurality of substrates and stampers are arranged between the first press face and the second press face and a lump imprint is performed. However, pressure unevenness among respective substrates and pressure unevenness within each substrate occur.

The above problem is not exposed in an ordinary die forming work performing work for concave and convex shaping in a micron or millimeter order. However, such a problem has been first exposed in a nano-imprint step for patterning a magnetic recording medium which applies a pressure of 100 MPa or more on the whole face of a disc surface with a diameter of a several centimeters typified by a representative 2.5 inch disc to transfer a fine concave and convex pattern on the face.

As explained above, the nano-imprint approach is a technique which is suitable for producing a fine structure having a size of wavelength of light or less and allows production of a fine structure with a considerably high throughput as compared with a lithographic process performed by the electron beam lithography or the converging ion beam lithography, and it is a technique effective for patterning a magnetic recording medium. However, when a high pressure pressing is performed at the room temperature and at the atmospheric pressure in order to improve a working accuracy and a production efficiency, such a problem occurs that a pattern can not be transferred on a whole face of a medium evenly due to deformation of a pressing machine itself.

SUMMARY OF THE INVENTION

In view of these circumstances, the present invention has been made, and an object thereof is to provide an imprint method and an imprint apparatus which can perform even pattern transfer with a high throughput.

An imprint apparatus according to a first aspect of the present invention includes: a first press plate having a first press face on which a substrate to be transferred with a concave and convex pattern of a portion to be pressed is placed, the portion to be pressed having an imprint stamper formed on a surface thereof with the concave and convex pattern and the substrate; a second press plate having a second press face opposed to the first press face, which is arranged such that the second press face presses a face of the imprint stamper which is opposed from a face thereof on which the concave and convex pattern is formed; a pressure applying unit which applies a pressure on a face of the second press plate which is opposed from the second press face; a first supporting member which supports a face of the first press plate which is opposed from the first press face and has a section equal to or smaller than a bottom face of the substrate in size; and a frame structure which has a second supporting member supporting the first supporting member, a third supporting member supporting the pressure applying unit, and coupling members coupling respective both ends of the second supporting member and the third supporting member.

An imprint apparatus according to a second aspect of the present invention includes: a first press plate having a first press face on which a substrate to be transferred with a concave and convex pattern of a portion to be pressed is placed, the portion to be pressed having an imprint stamper formed on a surface thereof with the concave and convex pattern and the substrate; a second press plate having a second press face opposed to the first press face, which is arranged such that the second press face presses a face of the imprint stamper which is opposed from a face thereof on which the concave and convex pattern is formed; a pressure applying unit which applies a pressure on a face of the second press plate which is opposed from the second press face; a frame structure which has a second supporting member supporting the first press plate, a third supporting member supporting the pressure applying unit, and coupling members coupling respective both ends of the second supporting member and the third supporting member; a first member which is embedded in a region of the first press face on which the substrate is placed and which has a section equal to or smaller than a bottom face of the substrate and is made from material having a Young's modulus larger than that of the first press plate; and a second member which is embedded in a region of the second press face which presses the imprint stamper and which has a section equal to or smaller than the bottom face of the substrate and is made from material having a Young's modulus larger than that of the second press plate.

An imprint apparatus according to a third aspect of the present invention includes: a first press plate having a first press face; a second press plate having a second press face opposed to the first press face; a pressure applying unit which applies a pressure on a face of the second press plate which is opposed from the second press face; a first supporting member which supports a face of the first press plate which is opposed from the first press face; a frame structure which has a second supporting member supporting the first supporting member, a third supporting member supporting the pressure applying unit, and coupling members coupling respective both ends of the second supporting member and the third supporting member; and a plurality of press portions which are provided between the first press face and the second press face, wherein each of the plurality of press portions includes a third press plate having a third press face on which a substrate to be transferred with a concave and convex pattern of a portion to be pressed is placed, the portion to be pressed having an imprint stamper formed on a surface thereof with the concave and convex pattern and the substrate; a fourth press plate having a fourth press face opposed to the third press face, which is arranged such that the fourth press face presses a face of the imprint stamper which is opposed from a face thereof on which the concave and convex pattern is formed; a fourth supporting member which supports a face of the third press plate which is opposed from the third press face and has a section equal to or smaller than a bottom face of the substrate; and a first pressure receiving portion whose one end is fixed on a face of the fourth press plate which is opposed from the fourth press face and whose other end is fixed to the second press face, and which has a section equal to or smaller than a face of the imprint stamper which is opposed from a face thereof on which the concave and convex pattern is formed.

An imprint method according to a fourth aspect of the present invention includes: performing transcription of a concave and convex pattern with such a pressure that a pressure applied on a substrate is 100 MPa or more using an imprint apparatus above-described.

DETAILED DESCRIPTION OF THE INVENTION

Embodiments of the present invention will be explained below in detail with reference to the drawings.

First Embodiment

Figure 1A:
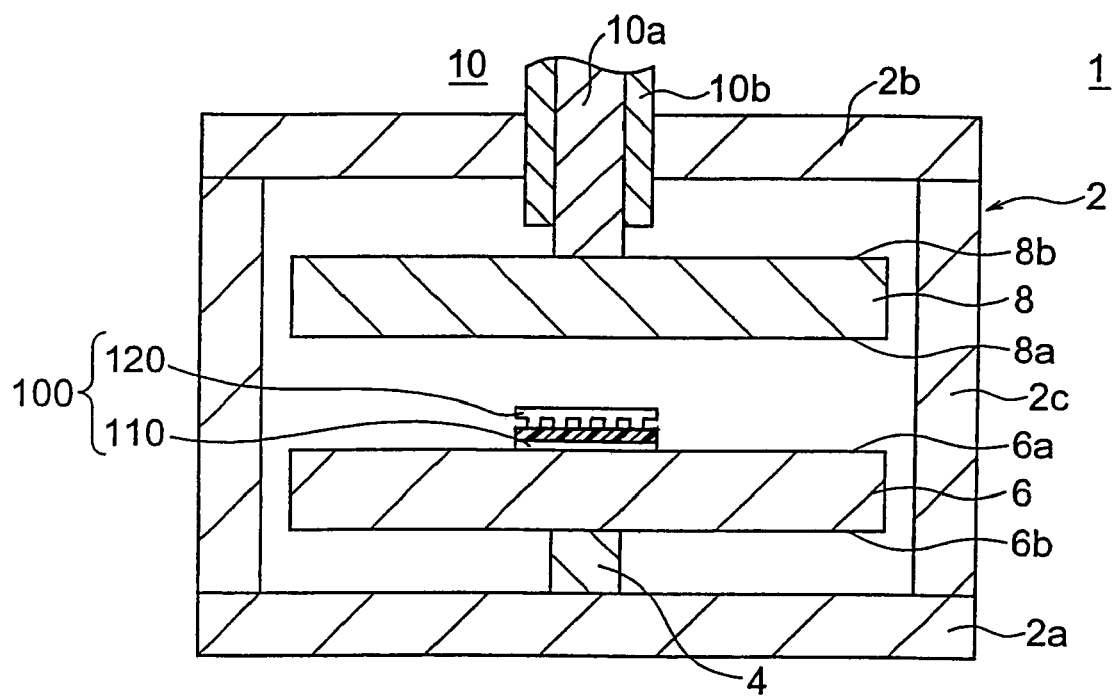
FIGS. 1A and 1B are sectional views showing an imprint apparatus according to a first embodiment of the present invention.
Figure 1B:
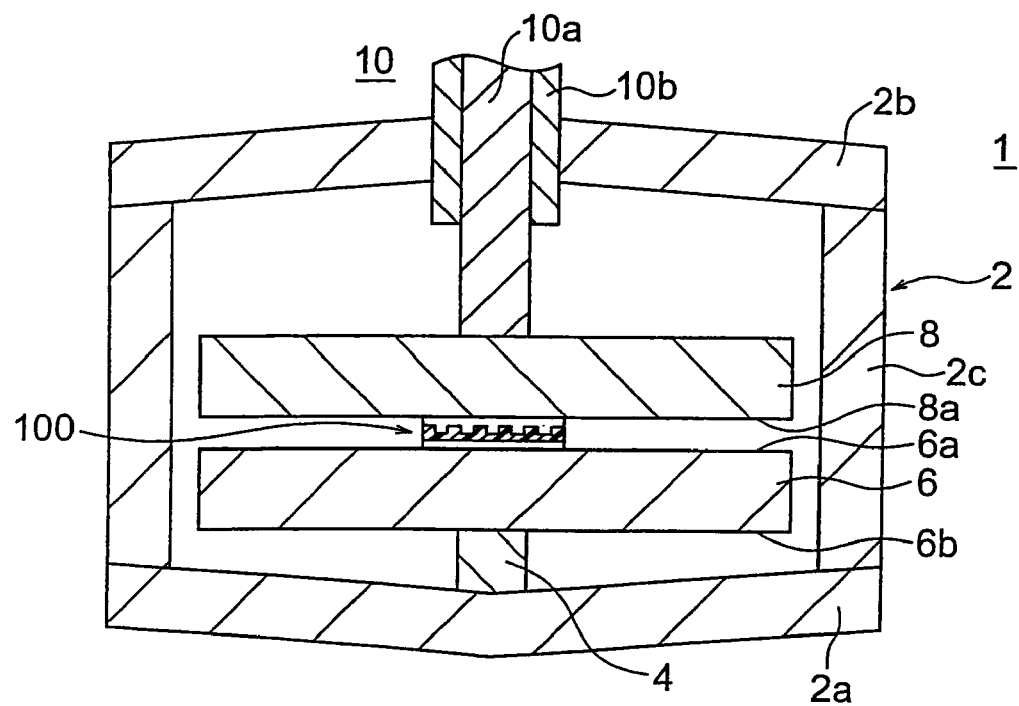

An imprint apparatus according to a first embodiment of the present invention will be explained with reference to FIGS. 1A and 1B. FIG. 1A is a sectional view showing an imprint apparatus 1 according to the first embodiment before application of pressure, and FIG. 1B is a sectional view showing the imprint apparatus 1 according to the first embodiment during pressure application.

The imprint apparatus 1 according to the embodiment is provided with a frame structure 2, a supporting member 4, a lower press plate 6, an upper press plate 8, and a pressure applying unit 10. The frame structure 2 is provided with a lower supporting member 2a which supports the supporting member 4 in a fixing manner, an upper supporting member 2b which supports the pressure applying unit 10, and coupling members 2c which couple respective both ends of the lower supporting member 2a and the upper supporting member 2b. The lower press plate 6 is provided with a lower face 6b which is connected with the supporting member 4 and has an area larger than a sectional area of the supporting member 4, and a upper face 6a on which a portion to be pressed 100 is placed and which serves as a press face. The portion to be pressed 100 has a substrate 110, a resist layer (not shown) applied on the substrate, and an imprint stamper 120 formed on a surface thereof with concave and convex, where the resist layer and a face of the imprint stamper on which the convexconcave has been formed are opposed to each other. One end of the supporting member 4 is fixed to the lower supporting member 2a and the other end thereof is fixed to the lower face 6b of the lower press plate 6.

The upper press plate 8 is constituted such that a lower face 8a thereof serves as a press face pressing the portion to be pressed 100 placed on the press face of the lower press plate 6 and a upper face 8b thereof receives a pressure generated from the pressure applying unit 10. The pressure applying unit 10 is provided with a shaft 10a, a cylinder 10b having a hole through which the shaft 10a slides, and a driving unit (not shown) driving the shaft. The driving unit drives the shaft 10a utilizing hydraulic pressure in this embodiment. The driving unit may be another mechanism e.g. a servomotor and so on. The shaft 10a has a distal end fixed to the upper face 8b of the upper press plate 8. The cylinder 10b is fixed to the upper supporting member 2b of the frame structure 2.

In the embodiment, such an arrangement is performed that the center axis of the shaft 10a runs on the center of the substrate 110 to coincide with the center axis of the supporting member 4. Such a constitution is employed that the maximum diameter (size) of the supporting member 4 in a section thereof is equal to or smaller than the maximum diameter (size) of the substrate 110. That is, such a constitution is employed that a sectional area of the supporting member 4 is equal to or smaller than a sectional area of the substrate 110.

Next, an operation of the embodiment will be explained with reference to FIG. 1B.

When the shaft 10a is driven by the shaft driving unit of the pressure applying unit 10 to be moved downwardly, the press face 8a of the press plate 8 presses the portion to be pressed 100 placed on the press face 6a of the lower press plate 6. A pressurizing force at that time is sustained by the frame structure 2. The lower supporting member 2a of the frame structure 2 deforms in a direction of the press pressure and the upper supporting member 2b deforms in a direction opposed to the press pressure due to the pressurizing force imparted by the shaft 10a and a reaction force against the pressurizing force. At that time, since the supporting member 4 having a sectional size equal to the size of the substrate 110 or less is present between the lower press plate 6 and the lower supporting member 2a, a pressure from the lower supporting member 2a of the frame structure 2 concentrates on the supporting member 4 and a pressure conducts from the supporting member 4 to the lower press plate 6, so that deformation of the press face 6a of the lower press plate 6 becomes small.

Thereby, in the embodiment, pressure acting on the substrate 110 and the imprint stamper 120 is made even so that the concave and convex pattern on the surface of the imprint stamper can be transferred on the whole face of the substrate 110. That is, even pattern transfer can be performed with a high throughput.

On the other hand, in the conventional imprint apparatus, a pressure throttling portion is not provided, which is different from the embodiment, that is, such a constitution is employed that a lower face of the lower plate comes in direct contact with the lower supporting member of the frame structure. Therefore, during pressing, the upper supporting member and the lower supporting member of the frame structure deform in a direction opposed to the press pressure due to a pressurizing force imparted by the shaft and a reaction force against the pressurizing force, and the lower press plate deforms in an application direction of force from the shaft at its portion opposed to the shaft and it deforms in a direction reverse to the application direction of pressure at both ends of the lower supporting member due to deformation of the lower supporting member. Therefore, in the conventional imprint apparatus, unlike the embodiment, the substrate and the imprint stamper are put in an uneven state of pressure where a weight is concentrated on their outer peripheral sides but it is not imparted on their inner sides due to deformation of the press face of the lower press plate in the vicinity of the substrate and the imprint stamper, the concave and convex pattern on the surface of the imprint stamper can not be transferred except for its outer peripheral side, which results in defective transfer.

As explained above, according to the embodiment, even pattern transfer can be performed with a high throughput.

It is preferable that the center of the position of the supporting member 4 according to the embodiment is positioned in a direction of pressure imparted on the imprint stamper 120 and the imprint face of the substrate 110 opposed to the supporting member 4. If the supporting member 4 is present at a position deviated from the direction of a pressure acting on the imprint face, a pressure acts on the imprint face eccentrically in a direction of the deviation of the supporting member 4, which makes even pressurizing impossible.

It is preferable that the supporting member 4 according to the embodiment is formed in a free joint shank shape.

The supporting member 4 according to the embodiment serves so as to suppress influence of stain occurring due to pressurizing of the shaft 10a and a reaction force of the frame structure 2 against the same to pressure dispersion between the imprint stamper 120 and the substrate 110. Specifically, the supporting member 4 is provided with a necked portion having a neck structure with a sectional area smaller than an outer peripheral contour size of the substrate 110, namely, a shank structure, between the frame structure 2 and the lower press plate 6, or the shaft 10a and the upper press plate 8. The shank structure has such a feature that, when a section of the shank portion is obtained by a plane perpendicular to a direction of a pressure applied, any structure is not present around the shank portion. Accordingly, when a pressure generated at one side of the shank is transmitted to the other side of the shank, the pressure is necessarily concentrated on a portion throttled as the shank. That is, when the shank structure is present, even if strain over a large area of material on one side of the shank structure occurs, the strain is not transmitted to a side of the shank opposed from the one side thereof. Accordingly, pressure unevenness of imprint occurring due to transmission of the strain of the frame structure 2 to the upper press plate 8 or the lower press plate 6 can be suppressed. If a tip of the shank structure is spherical, the shank structure is a free joint shank mechanism, thereby it is possible to reduce further the strain.

In the imprint apparatus according to the embodiment shown in FIGS. 1A and 1B, the supporting member 4 formed in the shank shape is provided between the lower press plate 6 and the lower supporting member 2a, however the shaft itself serves as a pressure throttling portion on the side of the upper press plate 8. This is effective when a sectional area of the shaft 10a is smaller than an outer diameter of the substrate 110. Such a constitution may be employed that another pressure throttling portion with a shank shape is provided between the shaft 10a and the upper press plate 8 in addition to the shaft 10a.

Second Embodiment

Figure 2A:
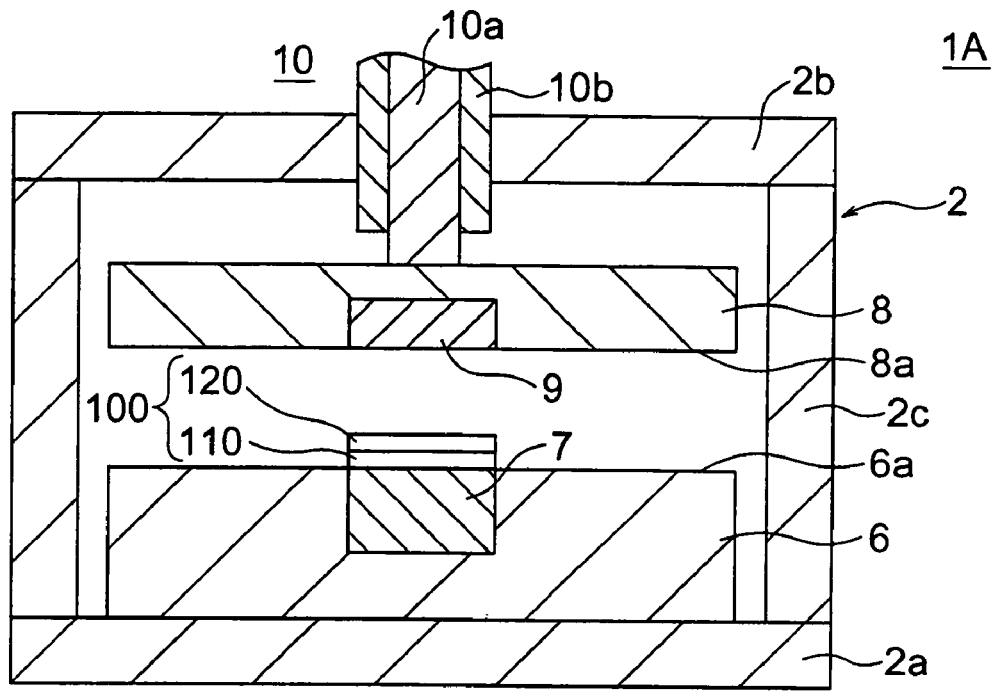
FIGS. 2A and 2B are sectional views showing an imprint apparatus according to a second embodiment of the present invention.
Figure 2B:
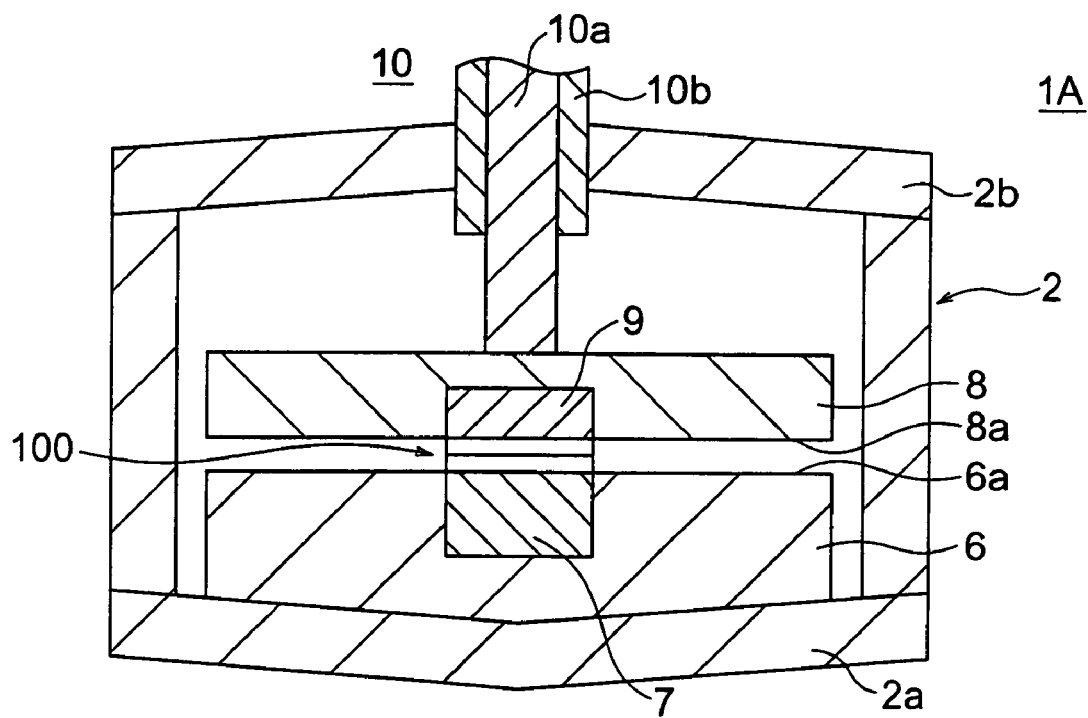

Next, an imprint apparatus according to a second embodiment of the invention will be explained with reference to FIGS. 2A and 2B. FIG. 2A is a sectional view showing an imprint apparatus 1A according to the second embodiment before an pressing operation, and FIG. 2B is a sectional view showing the imprint apparatus 1A according to the second embodiment during the pressing operation.

The imprint apparatus 1A according to the embodiment has such a constitution that the supporting member 4 is removed a pressure receiving portion 7 made from material with Young's modulus larger than that of the lower press plate 6 is embedded in a region of the press face 6a of the lower press plate 6 where the portion to be pressed 100 is placed, and a pressure receiving portion 9 made from material with Young's modulus larger than that of the upper press plate 8 is embedded in a region of the press face 8a of the upper press 8 of which the portion to be pressed 100 presses in the imprint apparatus 1 of the first embodiment shown in FIG. 1A.

In the embodiment, the pressure receiving portion 7 and the pressure receiving portion 9 made from material with Young's modulus larger than those of materials for the respective press plates are provided from the press face 6a and the press face 8a coming in contact with the substrate 110 and the imprint stamper 120, respectively, to fixed depths. The pressure receiving portions 7 and 9 are fixed to the lower press plate 6 and the upper press plate 8, respectively.

In the embodiment, such an arrangement is employed that the center axis of the shaft 10a runs through the center of the substrate 110 to coincide with the center axes of the pressure receiving portions 7 and 9. Such a constitution is employed that the maximum diameters (sizes) of the pressure receiving portions 7 and 9 in the respective sections thereof are equal to or less than the maximum diameter (size) of the substrate 110. That is, such a constitution is employed that the sectional areas of the pressure receiving portions 7 and 9 are equal to or less than the sectional area of the substrate 110.

While the imprint apparatus according to the embodiment is put in a pressing state, as shown in FIG. 2B, the shaft 10a performs pressurizing so as to press the press plate 8 onto the press plate 6, where the pressurizing is sustained by the frame structure 2. During pressing, the lower supporting member 2a of the frame structure 2 deforms in a direction of pressurizing conducted by the shaft, and the upper supporting member 2b deforms in a direction opposed to the pressurizing direction, so that a portion of the lower supporting plate 6 which is opposed to the shaft 10a deforms in an application direction of a pressure from the shaft 10a and portions of the lower supporting plate 6 which are opposed to both end portions of the lower supporting member 2a deform in a direction opposed to the application direction of the pressure from the shaft 10a due to deformation of the lower supporting member 2a. At that time, the substrate 110 and the imprint stamper 120 are pressurized by the pressure receiving portions 7 and 9 made from materials with large Young's modulus provided in the respective press plates 6 and 8. In this case, a pressure transmitted from the frame structure 2 toward the substrate 110, and the imprint stamper 120 spreads between the portions where the pressure receiving portions 7 and 9 are not provided, namely, the frame structure 2, and the pressure receiving portions 7 and 9 in the directions of the press plates 6 and 8 without causing pressure concentration. However, the pressure concentrates on the pressure receiving portions 7 and 9 having sectional sizes equal to or less than the size of the substrate 110 and having the large Young's modulus in portions from the pressure receiving portions 7 and 9 to the substrate 110 and the imprint stamper 120. Accordingly, deformation slightly occurs on the whole faces of the press faces of the lower press plate 6 and the upper press plate 8. However, since rigidities of the pressure receiving portions 7 and 9 coming in contact with the substrate 110 and the imprint stamper 120 are high, deformations of the pressure receiving portions 7 and 9 are small, so that a pressure acts on in-plane of the imprint face evenly. That is, even pattern transfer can be performed with a high throughput.

In the embodiment, it is preferable that the pressure receiving portion with the large Young's modulus is made from material harder than that for each press plate constituting the imprint apparatus or ordinary members constituting the frame structure 2. In particular, it is preferable that the pressure receiving portion is made from material harder than that for the press plate in which the pressure receiving portion is embedded and which surrounds the pressure receiving portion, namely, it is made from material with a large Young's modulus.

The ordinary member constituting the imprint apparatus includes, for example, steel, stainless steel, copper steel, aluminum steel, ceramic, alloy thereof or mixture thereof, and materials obtained by heat treatment on these materials. Of these materials, for example, aluminum alloy has a Young's modulus in a range of 7000 kgf/mm$^2$ to 10000 kgf/mm$^2$ and quenched stainless steel has a Young's modulus in a range of 18000 kgf/mm$^2$ to 20000 kgf/mm$^2$.

On the other hand, the material with a large Young's modulus in the embodiment is material called "cemented carbide" typified by material constituted of, for example, fine powder of tungsten carbide and cobalt binder, and it has a Young's modulus in a range of 46000 kgf/mm$^2$ to 62000 kgf/mm$^2$. However, if materials having a large Young's modulus can be used for the pressure receiving portion according to the embodiment, material to be used is not limited to the above examples.

The pressure receiving portion according to the embodiment must be provided in each of the press plates.

Even if the pressure receiving portion is provided in only one of the press plates, the press plate which has no pressure receiving portion receives deformation from the frame structure to be strained, so that the above-described advantage or merit can not be achieved.

It is preferable that the pressure receiving portion according to the second embodiment is positioned on an extension line in a direction in which a pressure is applied from the imprint face of the imprint stamper opposed to the substrate 110.

Third Embodiment

Figure 3A:
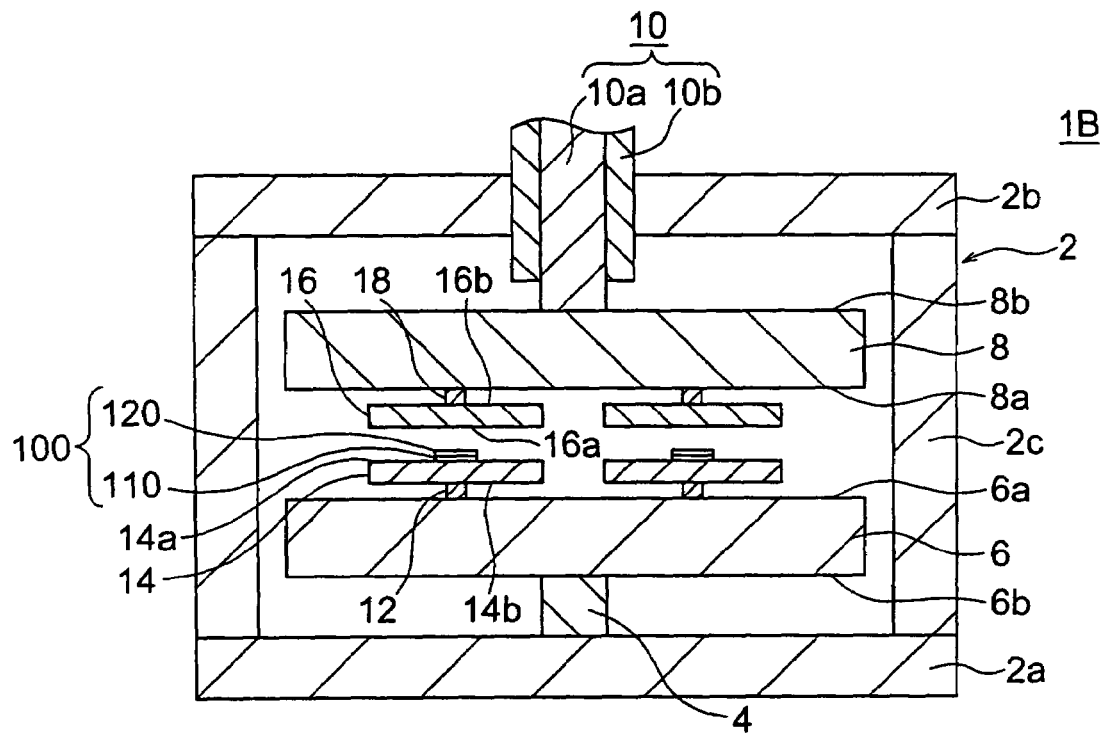
FIGS. 3A and 3B are sectional views showing an imprint apparatus according to a third embodiment of the present invention.
Figure 3B:
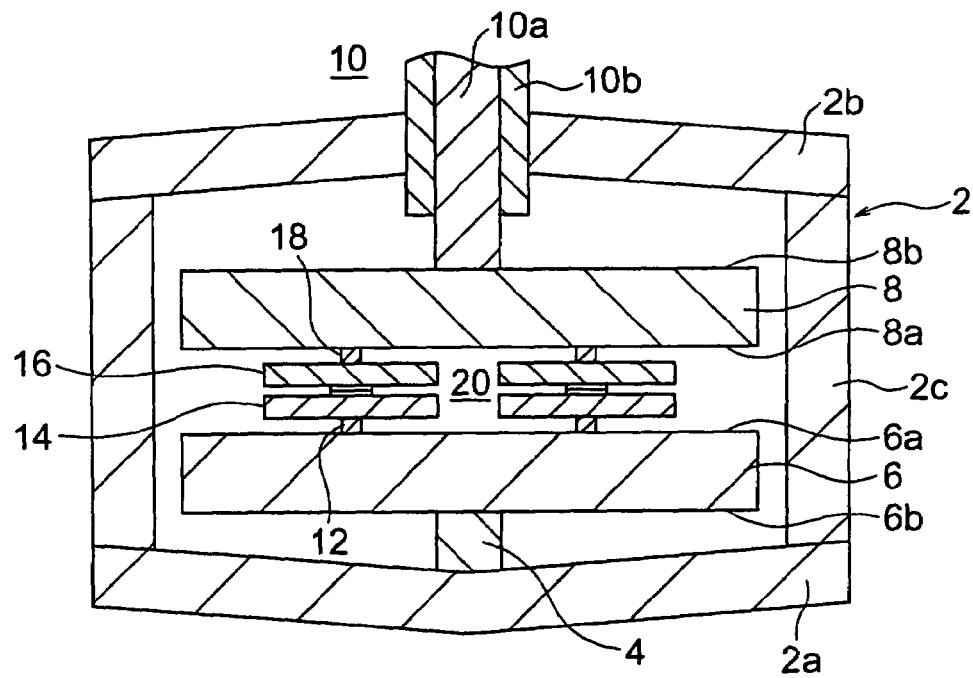

Next, an imprint apparatus according to a third embodiment of the invention will be explained with reference to FIGS. 3A and 3B. FIG. 3A is a sectional view showing an imprint apparatus 1B according to the third embodiment before an pressing operation, and FIG. 3B is a sectional view showing the imprint apparatus 1B according to the third embodiment during the pressing operation.

The imprint apparatus 1B according to the embodiment is an apparatus which performs imprint work on a plurality of substrates 110 in a bundle by a singular pressing work. FIGS. 3A and 3B show an imprint apparatus which performs imprint work on two sets of portions to be pressed 100, each constituted of a substrate 110 and an imprint stamper 120, by a singular pressing work at the same time. The imprint apparatus 1B according to the embodiment has such a constitution that a plurality of press portions 20 are provided between the press face 6a of the lower press plate 6 and the press face 8a of the upper press plate 8 in the imprint apparatus 1 according to the first embodiment shown in FIG. 1A. Each press portion 20 is provided with a lower press plate 14 and an upper press plate 16, a supporting member 12 provided between the lower press plate 6 and the lower press plate 14, and a pressure receiving portion 18 provided between the upper press plate 16 and the upper press plate 8. It is preferable that each of the pressure throttling portions 12 and 18 is formed in a shank shape.

One end of the supporting member 12 is fixed to the press face 6a of the lower press plate 6 and the other end thereof is fixed to a lower face 14b of the lower press plate 14. One end of the pressure receiving portion 18 is an upper face 16b of the upper press plate 16, and the other end thereof is fixed to the press face 8a of the upper press plate 8.

The substrate 110 which is applied with a resist layer and constitutes the portion to be pressed 100 is placed on the press face 14a of the lower press plate 14, and the imprint stamper 120 is disposed such that an imprint face thereof is opposed to the resist layer.

In the third embodiment, such an arrangement is adopted that the center axis of the shaft 10a is coincident with the center axis of the supporting member 4. Such an arrangement is also employed that the center axes of supporting member 12 and the pressure receiving portion 18 run through the center of the substrate 110. Such a constitution is employed that the maximum diameters (sizes) of the supporting member 12 and the pressure receiving portion 18 in the respective sections thereof are equal to or smaller than the maximum diameters (sizes) of the substrate 110. That is, such a constitution is employed that the respective sectional areas of the supporting member 12 and the pressure receiving portion 18 become equal to or smaller than the substrate 110. Incidentally, the sizes of the substrate 110 and the imprint stamper 120 are approximately equal to each other.

In the embodiment, the section of the supporting 4 is larger than the size of the substrate 110 or the imprint stamper 120.

In the imprint apparatus according to the embodiment thus constituted, pressure is generated between the press plates 6 and 8 by using the shaft 10a to perform a singular pressing work, and the pressure is transmitted to press plates 14 and 16 through each supporting member 12 and each pressure receiving portions 18 so that strains of the press plates 6 and 8 to each substrate 110 position are blocked by the supporting member 12 and the pressure receiving portion 18. Therefore, a pressure is approximately evenly applied to each substrate within the imprint face, so that even pattern transfer can be performed on each substrate with a high throughput.

It is preferable that the plurality of substrates 110 are positioned in equal distances from the supporting member 4, that is, they are arranged concentrically at equal intervals from an extension line of the supporting member 4, as shown in FIGS. 3A and 3B such that strains in the press plates 6 and 8 occur symmetrically to the supporting member 4.

In the first to third embodiments, the pressure applying unit 10 is a hydraulic press using a hydraulic cylinder, but it may be a machine press typified by a crank press. Any pressure applying unit which allows even pressurizing can be used without limiting the above presses.

Next, the embodiments of the invention will be explained in detail with reference to Examples. It is to be noted that the present invention is not limited to these Examples.

EXAMPLE 1

Figure 4:
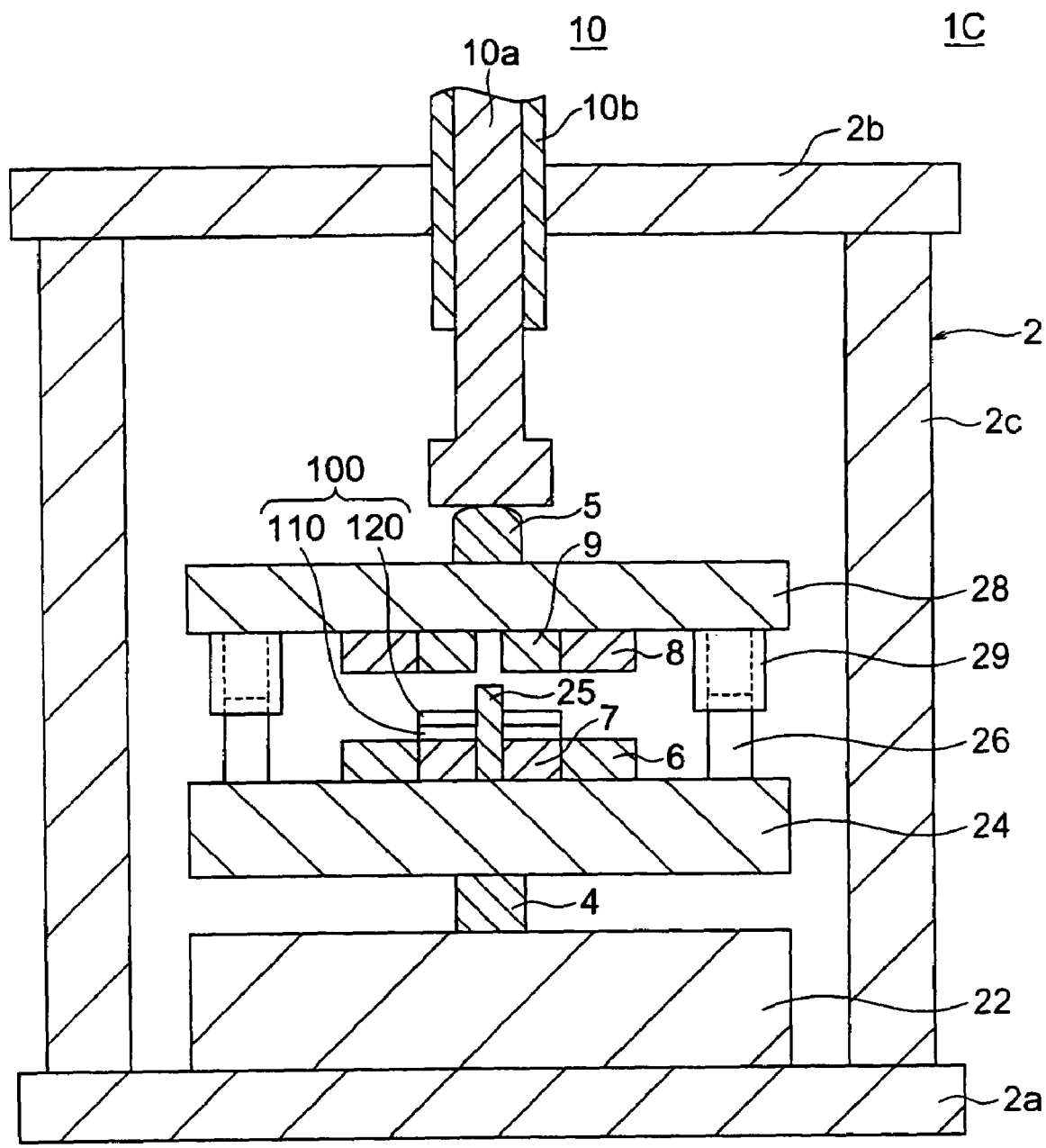
FIG. 4 is a sectional views showing an imprint apparatus according to an example 1 of the present invention.
Figure 5:
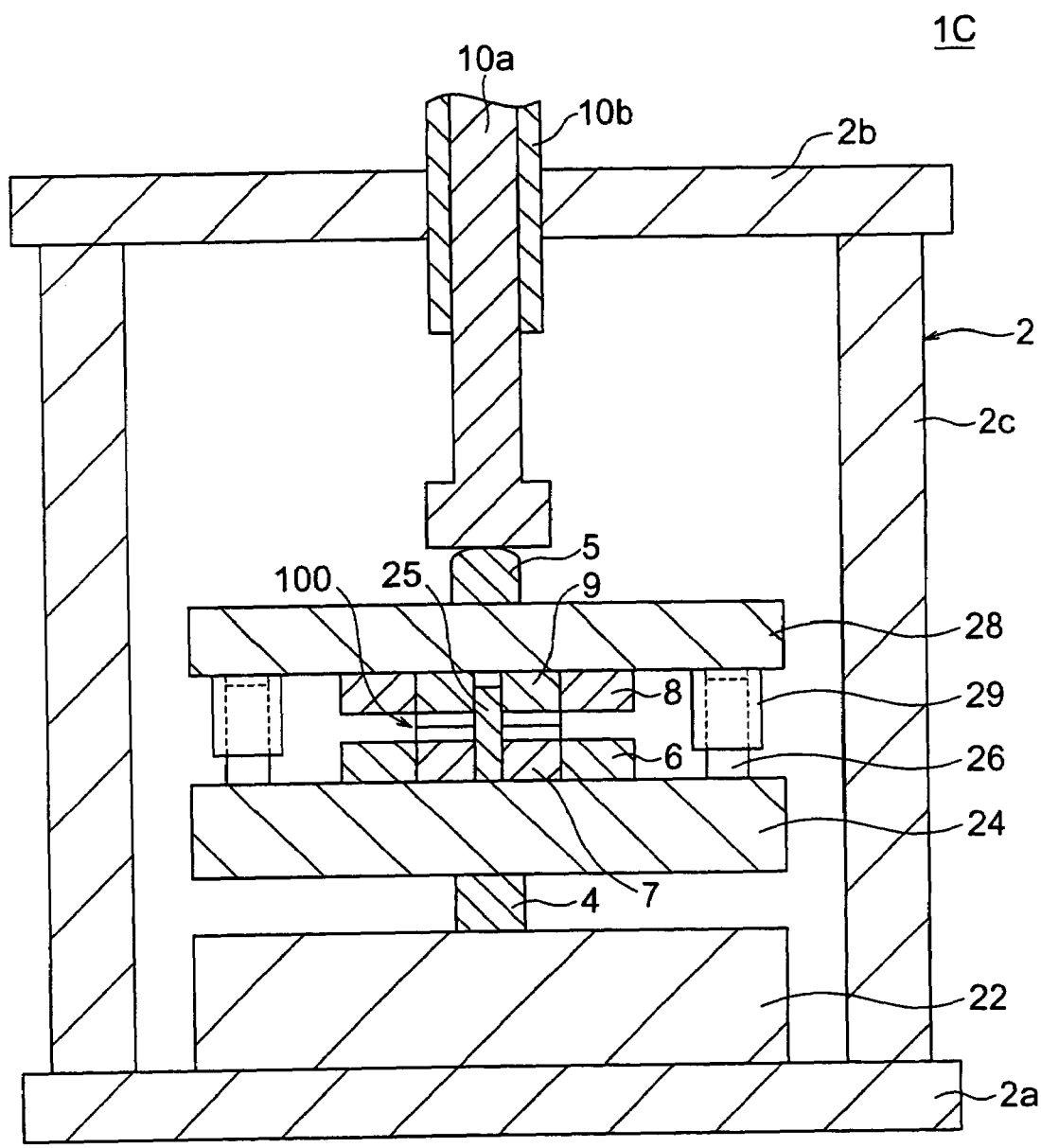
FIG. 5 is a sectional views showing the imprint apparatus according to the example 1 of the present invention during pressure application.

An imprint apparatus according to Example 1 of the present invention will be explained with reference to FIGS. 4 and 5. FIG. 4 is a sectional view of an imprint apparatus 1C according to the Example 1 before performing pressing work, and FIG. 5 is a sectional view of the imprint apparatus 1C according to the Example 1 during pressing work.

The imprint apparatus 1C of Example 1 has such a constitution that a bolster 22 is provided between the lower supporting member 2a of the frame structure 2 and the supporting member 4, a lower die 24 is provided between the supporting member 4 and the lower press plate 6, and an upper die 28 and a pressure throttling portion 5 are provided between the upper press plate 8 and the shaft 10a in the imprint apparatus 1 according to the first embodiment shown in FIG. 1A. The bolster 22 is provided such that its lower face comes in direct contact with the lower supporting member 2a, and one end of the supporting member 4 is fixed on an upper face of the bolster 22. The other end of the supporting member 4 is fixed to a lower face of the lower die 24. Such a constitution is employed that the lower press plate 6 is provided on an upper face of the lower die 24 and the pressure receiving portion 7 is embedded on a region of the press face of the lower press plate 6 where a portion to be pressed 100 is placed. Incidentally, the portion to be pressed 100 is constituted of a substrate 110 applied with a resist layer and an imprint stamper 120 having an imprint face provided so as to face the resist layer. A positioning pin 25 for positioning the member to be pressed 100 is provided at the center of the pressure receiving portion 7. A plurality of guide pins 26 serving as guides when the upper die 28 moves downwardly are provided at end portions of an upper face of the lower die 24.

The upper press plate 8 is provided so as to be fixed on a face of the upper die 28 which is opposed to the lower die 24, and guide portions 29 having holes which allow sliding of the guide pines 26 are provided to be fixed on the face. A pressure receiving portion 9 is embedded in a region of a press face of the upper press plate 8 which presses an portion to be pressed 100. Incidentally, it is preferable that the pressure receiving portions 7 and 9 are constituted of material harder than that for the press plates 6 and 8, for example, cemented carbide.

A pressure receiving portion or the pressure throttling portion 5 is provided on the upper face of the upper die 28. The pressure receiving portion 5 has a free shank structure where a side thereof opposed to the shaft 10a of the pressure applying unit 10 constituted by, for example, a hydraulic apparatus is formed in a spherical shape. By adopting the free shank structure, a flat distal end face of the shaft 10a comes in contact with the spherical face of the pressure receiving portion 5 substantially at one point, so that a pressurizing direction can be made constant.

In the Example 1, such an arrangement is adopted that the center axis of the shaft 10a runs on the center of the substrate 110 to coincide with the respective center axes of the supporting member 4 and the pressure receiving portion 5. Such a constitution is employed that the maximum diameters (sizes) of the supporting member 4 and the pressure receiving portion 5 in the respective sections thereof are equal to or smaller than the maximum size (size) of the substrate 110. That is, such a constitution is also employed that the respective sectional areas of the supporting member 4 and the pressure receiving portion 5 are equal to or smaller than the sectional area of the substrate 110.

The Example 1 is constituted such that the maximum diameters (sizes) of the pressure receiving portions 7 and 9 in the respective sections thereof are equal to or smaller than the maximum diameter (size) of the substrate 110. That is, such a constitution is employed that the respective sections of the pressure receiving portions 7 and 9 are equal to or smaller than the section of the substrate 110.

In Example 1, the pressure applying unit 10 can apply a pressure of 40 t. A diameter of a section of the pressure receiving portion 5 which comes in contact with the upper die 28 is 30 mm. A diameter of a section of the supporting member 4 which comes in contact with the lower die 24 is 50 mm. The bolster 22 and the pressure applying unit 10 are supported by the frame structure 2 which can sustain pressurizing. The shaft 10a of the pressure applying unit 10, the supporting member 4, the pressure receiving portion 5, the dies 24 and 28, the press plates 6 and 8, the bolster 22, and the lower supporting member 2a, the upper supporting member 2b, and the coupling members 2c of the frame structure 2 are respectively made from quenched stainless steel with a Young's modulus of 50000 kgf/mm².

Since the substrate 110 to be subjected to imprint is formed in a doughnut shape, both the pressure receiving portions 7 and 9 made from cemented carbide has hollow cylindrical shapes. A positioning pin 25 for positioning the substrate 110 and the imprint stamper 120 is provided in a cavity formed at a central portion of the pressure receiving portion 7.

The substrate 110 to be subjected to imprint is a crystallized glass substrate with a doughnut shape having a diameter of 65 mm, an inner diameter of 20 mm, and a thickness of 0.6 mm. A surface of the glass substrate 110 is formed with a magnetic recording layer utilizing sputtering process, and novolac type resist is applied on the magnetic recording layer so as to have a thickness of 100 nm by a spin coating process.

The imprint stamper 120 is a stamper made from nickel and formed in a doughnut shape, and having a diameter of 65 mm, an inner diameter of 20 mm, and a thickness of 0.3 mm. The stamper surface is provided in a radial position range of 21 nm to 32 nm with a concave and convex pattern with a concentric track shape having a track width of 300 nm, a groove width of 200 nm and a concexoconcave depth of 70 nm.

The imprint stamper 120 and the substrate 110 are placed on the pressure throttling portion 7 by opposing the concave and convex face of the imprint stamper 120 and the resist film of the substrate 110 to each other and fitting the center holes thereof on the positioning pin 25.

In Example 1, in order to examine a pressure dispersion on the imprint face, 35 t pressing was conducted for one minute at the room temperature and at the atmospheric pressure by placing a pressure-sensitive paper constituted of a PET sheet with a thickness of 0.1 mm on the stamper and driving the shaft 10a of the pressure driving unit 10. A section of the imprint apparatus of Example 1 during pressing work is shown in FIG. 5.

EXAMPLE 2

Figure 6:
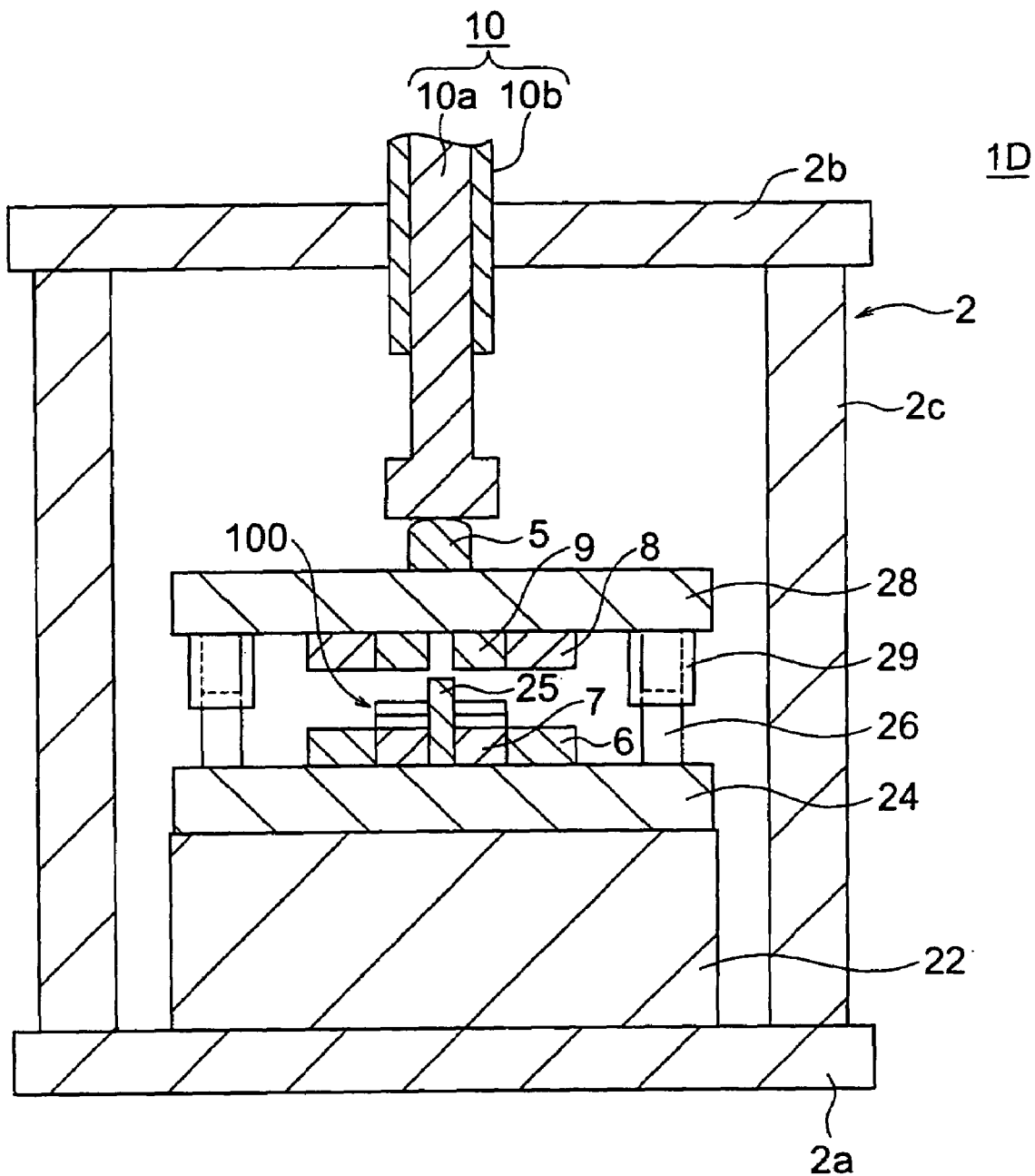
FIG. 6 is a sectional views showing an imprint apparatus according to an example 2 of the present invention.

Next, a constitution of an imprint apparatus according to Example 2 of the present invention is shown in FIG. 6. An imprint apparatus 1D of Example 2 is constituted such that the supporting member 4 positioned between the bolster 22 and the lower die 24 has been removed in the imprint apparatus 1C of Example 1 shown in FIG. 4. That is, such a constitution is employed that the lower die 24 has been directly mounted on the bolster 22.

In Example 2, in order to examine pressure dispersion on the imprint face, 35 t pressing was conducted for one minute at the room temperature and at the atmospheric pressure by placing a pressure-sensitive paper constituted of a PET sheet with a thickness of 0.1 mm on the stamper and driving the shaft 10a of the pressure driving unit 10.

COMPARATIVE EXAMPLE

Figure 7:
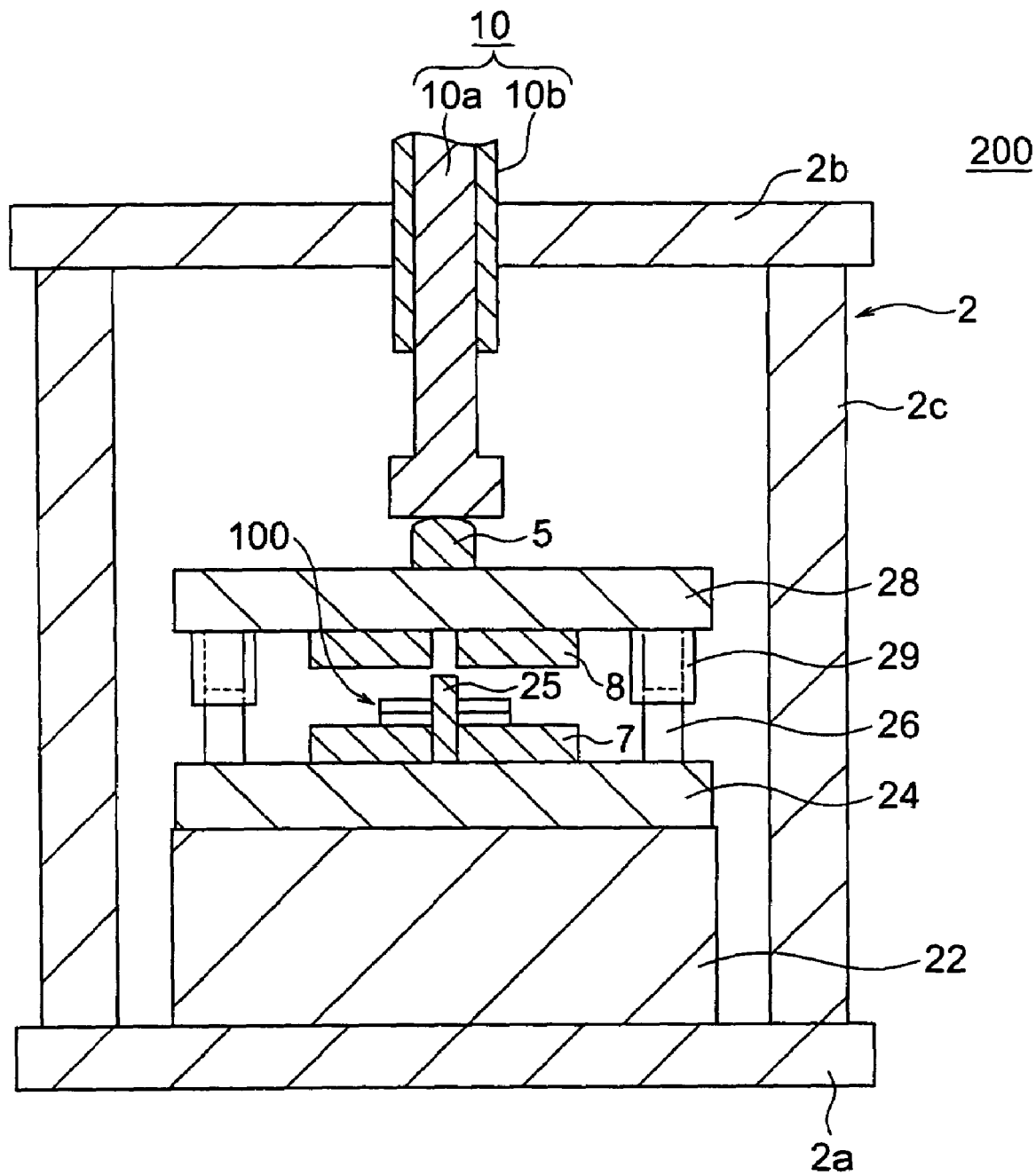
FIG. 7 is a sectional view showing a constitution of an imprint apparatus according to Comparative Example.

An imprint apparatus having a constitution shown in FIG. 7 was manufactured as Comparative Example. An imprint apparatus 200 of the Comparative Example was constituted such that the pressure receiving portions 7 and 9 were removed from the imprint apparatus 1D of Example 2 shown in FIG. 6. That is, such a constitution was employed that the portion to be pressed 100 was directly placed on the lower press plate 6 and the portion to be pressed 100 was directly pressed by the upper press plate 8. The positioning pin 25 for performing positioning the portion to be pressed 100 was not removed.

In Comparative Example, in order to examine a pressure dispersion on the imprint face, 35 t pressing was conducted for one minute at the room temperature and at the atmospheric pressure by placing a pressure-sensitive paper constituted of a PET sheet with a thickness of 0.1 mm on the stamper and driving the shaft 10a of the pressure driving unit 10.

Figure 8:
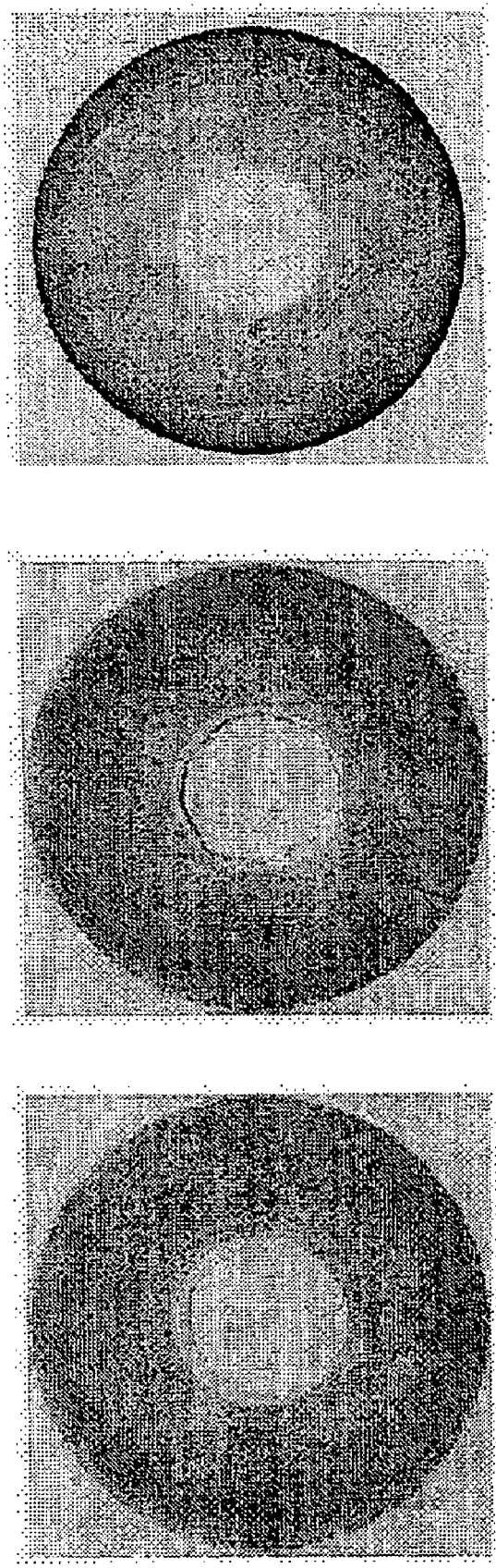
FIGS. 8(a), 8(b), and 8(c) are photographs of pressure dispersion results recorded on pressure-sensitive papers in the imprint apparatuses according to Example 1, Example 2, and Comparative Example.

Imprint experiments were conducted using the imprint apparatuses of Example 1, Example 2, and Comparative Example. The results obtained by the experiments are shown in FIGS. 8(*a*), 8(*b*), and 8(*c*), respectively.

Figure 9:
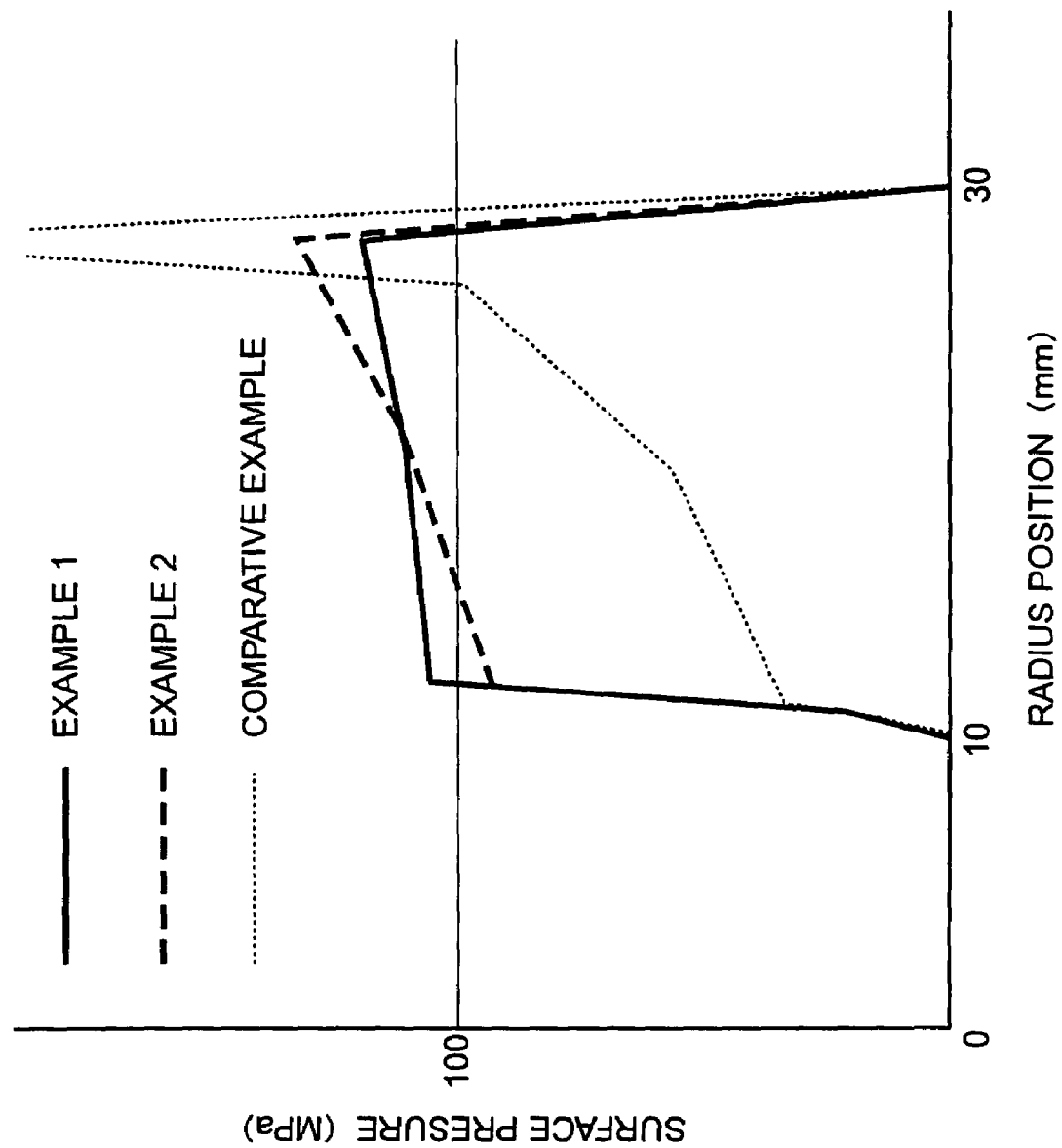
FIG. 9 is a graph showing average area pressures at a radius position based upon the pressure dispersion results shown in FIG. 8(a), 8(b), 8(c)

The pressure-sensitive paper is in a non-colored state before it is pressurized and pressure-sensitive material on a PET sheet is colored by pressurizing thereon so that a pressure dispersion on the PET sheet surface can be examined based on the degree of coloring. A graph is shown in FIG. 9 that is obtained by measuring average area pressures of respective radial positions from inner peripheries to outer peripheries from pressure dispersions in respective Examples and Comparative Example obtained form FIGS. 8(*a*) to 8(*c*).

From the result of the pressure dispersion in Comparative Example shown in FIG. 8(C), it is understood that the pressure dispersion is large on the disc. In this connection, it is also observed from the result shown in FIG. 9 that weight is largely biased toward the outside of the disc. It was confirmed that a concave and convex pattern was hardly transferred even in the imprint experiment in Comparative Example.

It is understood that pressure dispersion on the disc in Example 2 was considerably suppressed as compared with that in Comparative Example. As understood from the results shown in FIG. 9, slight outside weighting was still observed and the area pressure in the inner periphery did not reach 100 MPa. Such a transfer inferiority was observed even in the actual imprint experiment in Example 2 that concave and convex pattern or shape was not transferred on the resist surface in the inner periphery.

On the other hand, it was confirmed as the pressure dispersion result shown in FIG. 8(*a*) that approximately even pressure dispersion could be obtained in Example 1. It is understood from the result shown in FIG. 9 that slight outside weighting is observed but a pressure of 100 MPa or more is applied to the range from the inner periphery to the outer periphery of the disc. It was confirmed in the imprint experiment in Example 1 that approximately even concave and convex pattern was transferred over the range from the inside to the outside of the disc.

EXAMPLE 3

Figure 10:
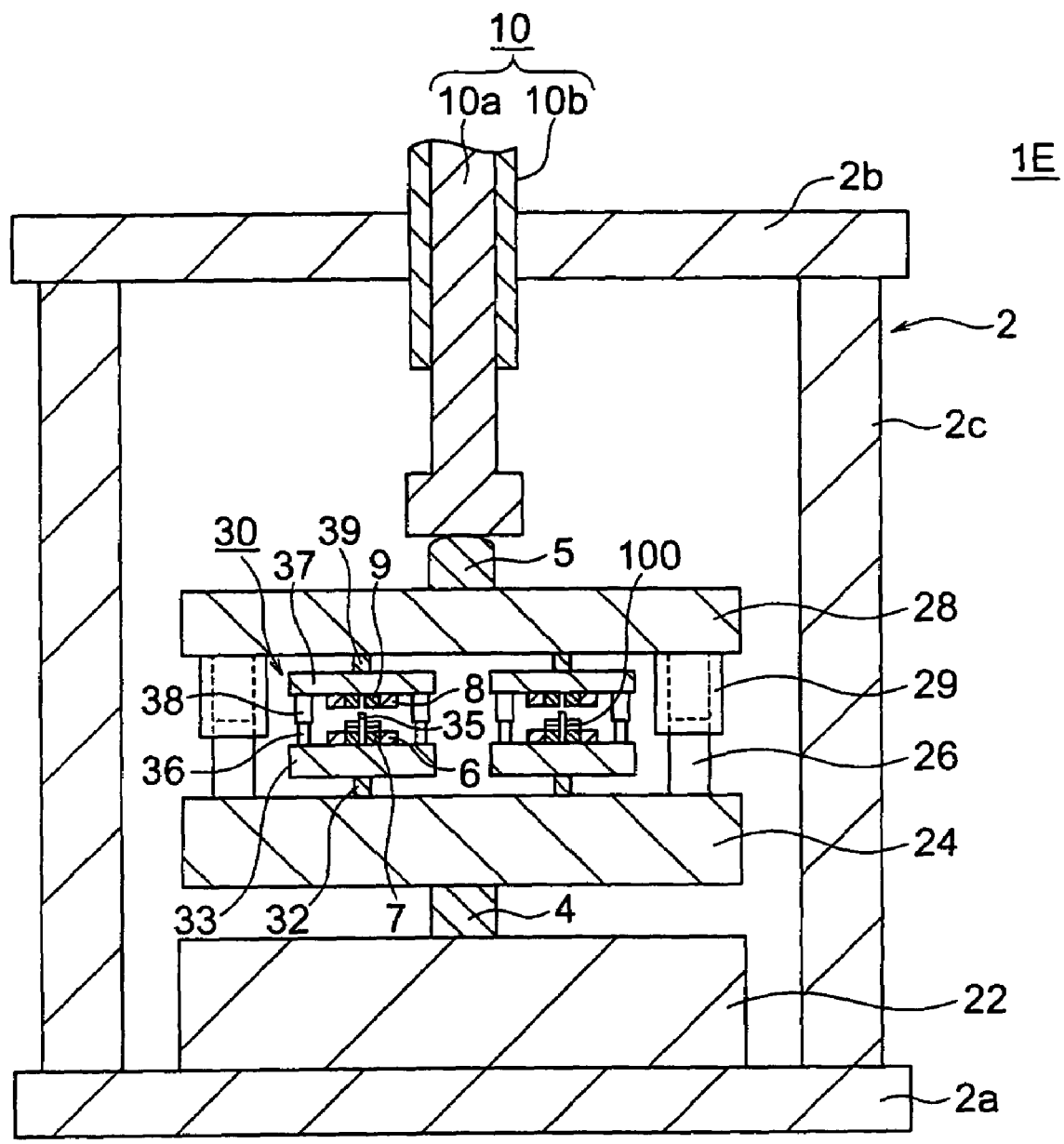
FIG. 10 is a sectional view showing a constitution of an imprint apparatus according to Example 3 according to the present invention.

Next, a constitution of an imprint apparatus according to Example 3 of the invention is shown in FIG. 10. The imprint apparatus of Example 3 is an apparatus for performing imprint work on a plurality of substrates in a bundle by a singular pressing work and it has such a constitution that the one press portion constituted of the lower press plate 6, the upper press plate 8, the positioning pin 25, and the pressure receiving portions 7 and 9 and provided between the lower die 24 and the upper die 28 is removed and a plurality of press portions 30 are provided between the lower die 24 and the upper die 28 in the imprint apparatus 1C of Example 1 shown in FIG. 5. Each press portion 30 is provided with a supporting portion 32 whose one end is fixed to an upper face of the lower die 24, a lower die 33 provided so as to be connected to the other end of the supporting member 32, an upper die 37, and a pressure receiving portion 39 whose one end is fixed on an upper face of the upper die 37 and whose other end is fixed to a lower face of the upper die 28.

The lower press plate 6 is provided so as to be fixed on the upper face of the lower die 33 and guide pin 36 are provided on end portions of the upper face. A pressure receiving portion 7 is provided in a region of the lower press plate 33 where a portion to be pressed 100 is placed, and a positioning pin 35 for positioning a portion to be pressed 100 is provided at the center of the pressure receiving portion 7.

An upper press plate 8 is fixedly provided and guide portions 38 provided with a hole through which a guide pin 36 slides are provided on a face of the upper die 37 which is opposed to the lower die 33. A pressure receiving portion 9 is provided in a region of the upper press plate 8 for pressing a portion to be pressed 100 and a hole in which a guide pin 35 is inserted is provided at the center of the pressure receiving portion 9. It is preferable that the pressure receiving portions 7 and 9 are made from material harder than that for the press plates 6 and 8, for example, cemented carbide.

A pressure receiving portion 5 is provided on an upper face of the upper die 28. The pressure receiving portion 5 has a free shank structure where a side thereof opposed to the shaft 10*a* of the pressure applying unit 10 constituted by, for example, a hydraulic apparatus is formed in a spherical shape. By adopting the free shank structure, a flat distal end face of the shaft 10*a* comes in contact with a spherical face of the pressure receiving portion 5 substantially at one point, so that a pressurizing direction can be made constant.

In Example 3, such an arrangement is adopted that the center axis of the shaft 10*a* is coincident with the respective center axes of the supporting member 4 and the pressure receiving portion 5. Such an arrangement is employed that the respective center axes of the supporting member 32 and the pressure receiving portion 39 run through the center of the substrate 110. Such a constitution is employed that the maximum diameters (sizes) of the supporting member 32 and the pressure receiving portion 39 in their respective sections are equal to or smaller than the maximum size (size) of the substrate 110. That is, such a constitution is also employed that the respective sectional areas of the supporting member 32 and the pressure receiving portion 39 are equal to or smaller than the sectional area of the substrate 110.

In Example 3, such a constitution is employed that the maximum diameters (sizes) of the pressure receiving portions 7 and 9 in their sections are equal to or smaller than the maximum diameter (size) of the substrate 110. That is, such a constitution is employed that the sectional areas of the pressure receiving portions 7 and 9 are equal to or smaller than the section of the substrate 110.

In the Example, the sections of the supporting member 4 and the pressure receiving portion 5 are larger than the size of the substrate 110 or the imprint stamper 120.

In the Example 3, the substrate 100 is a small disc having a diameter of 2 cm. The pressure applying unit 10 is a hydraulic apparatus which allows application of a pressure of 20 t. The pressure receiving portion 5 is fixed to the upper die 28, and the guide portion 38 provided on the upper die 28 and the guide pin 36 provided on the lower die 33 define a pressing direction. A diameter of a section in a portion of the pressure receiving portion 5 coming in contact with the upper die 28 is 30 mm. A diameter of a section of the supporting member 4 provided on a lower face of the lower die 24 is 50 mm. The supporting member 4 and the pressure receiving portion 5 act to throttle a pressure in a paired manner. The supporting member 4 is fixed to the bolster 22, and the bolster 22 and the pressure applying unit 10 are supported by the frame structure 2. In the Example 3, the shaft 10*a*, the supporting member 4, the pressure receiving portion 5, the dies 24 and 28, the bolster 22, and the frame structure 2 are made from quenched stainless steel with a Young's modulus of 50000 kgf/mm$^2$.

The supporting member 32 and the pressure receiving portion 39 are each formed in a shank structure and diameters of sections in their portions coming in contact with the dies 24 and 28 are respectively 8 mm. The supporting member 32 and the pressure receiving portion 39 act to throttle a pressure in a paired manner.

Figure 11:
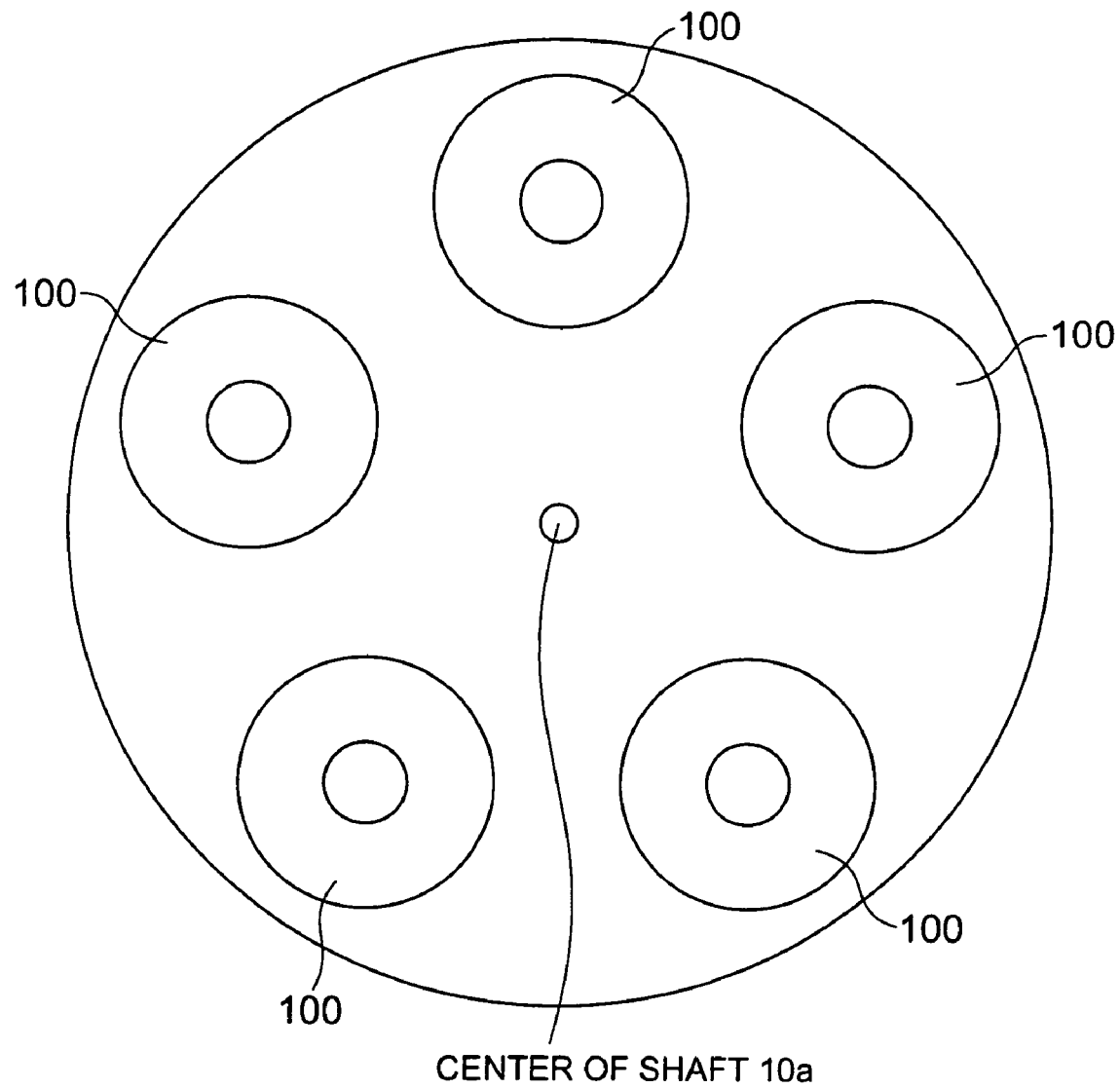
FIG. 11 is a view showing an arrangement of a portion to be pressed of Example 3.

As shown in FIG. 11, the portions to be pressed 100 on the die 24 are placed at positions concentric to the center of the pressure applying unit 10, namely, the center of the shaft 10*a*. Since a substrate to be subjected to imprint has a doughnut shape, the lower and upper pressure receiving portions 7 and 9 are each formed in a hollow cylindrical shape and they have cylindrical holes at their centers. A positioning pin 35 for positioning a substrate and a stamper is provided in the center hole of the pressure receiving portion 7.

A substrate to be subjected to imprint is a crystallized glass substrate with a doughnut shape having a diameter of 65 mm, an inner diameter of 20 mm, and a thickness of 0.6 mm. A surface of the glass substrate is formed with a magnetic recording layer utilizing a sputtering process, and novolac type resist is applied on the magnetic recording layer so as to have a thickness of 100 nm by a spin coating process.

The stamper is a stamper made from nickel and formed in a doughnut shape, and having a diameter of 20 mm, an inner diameter of 6 mm, and a thickness of 0.3 mm. The stamper surface is provided in a radial position range of 5 mm to 9 mm with a concave and convex pattern of a concentric track shape having a track width of 300 nm, a groove width of 200 nm and concexoconcave depth of 70 nm.

The stamper and the substrate are placed on the pressure throttling portion 7 by opposing the concave and convex face of the stamper and the resist film of the substrate to each other and fitting the center holes thereof on the positioning pin.

In the Example 3, in order to examine a pressure dispersion on the imprint face, 20 t pressing was conducted for one minute at the room temperature and at the atmospheric pressure by placing a pressure-sensitive paper constituted of a PET sheet with a thickness of 0.1 mm on the stamper and driving the shaft 10*a* of the pressure driving unit 10. The shape of the stamper surface is transferred on each substrate evenly.

EXAMPLE 4

Figure 12A:
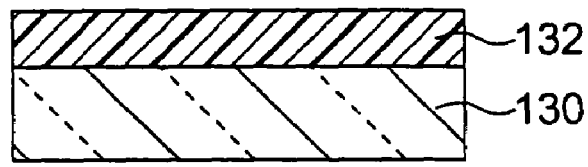
FIGS. 12A to 12D are sectional views showing manufacturing steps of an imprint stamper used in manufacturing steps for a magnetic recording medium according to Example 4 of the present invention.
Figure 12B:
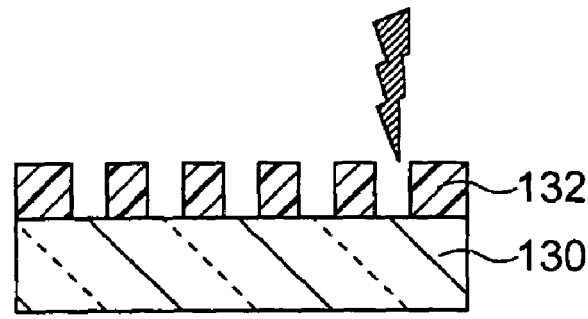

Next, Example 4 of the present invention will be explained with reference to FIGS. 12A to 13C. Example 4 is a manufacturing method which manufactures a magnetic recording medium using the imprint apparatus in Example 1. FIGS. 12A to 12D are sectional views showing manufacturing steps of an imprint stamper used for manufacturing a magnetic recording medium, and FIGS. 13A to 13C are sectional views showing manufacturing steps of a magnetic recording medium.

First, manufacturing steps of an imprint stamper will explained. As shown in FIG. 12A, a resist film for electron beam lithography 132 was applied on a glass original disc 130 so as to have a film thickness of about 100 nm by a spin coating process. Subsequently, a pattern for forming a concave and convex pattern was drawn on the resist film for electron beam lithography 132 using an electron beam. The electron beam was irradiated on a portion of the glass original disc 130 which corresponds to a portion serving as a non-magnetic material in a final recording medium. The pattern was drawn such that a recording portion had a track width of 300 nm and a magnetic material track width on the medium surface became 200 nm finally, and a sector servo pattern was drawn. Thereafter, a concexoconcave pattern was formed on a surface of the resist layer 132 by processing the resist layer 132 on the glass original disc 130 with a developing solution (see FIG. 12B). A portion on which an electron beam was irradiated was constituted in a recessed pattern.

Figure 12C:
Figure 13A:
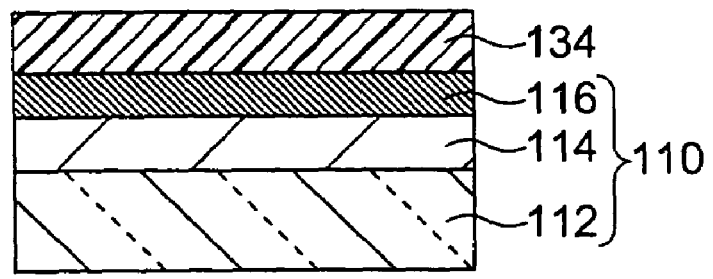
FIGS. 13A to 13C are sectional views showing manufacturing steps of the magnetic recording medium according to Example 4 of the present invention.
Figure 13B:
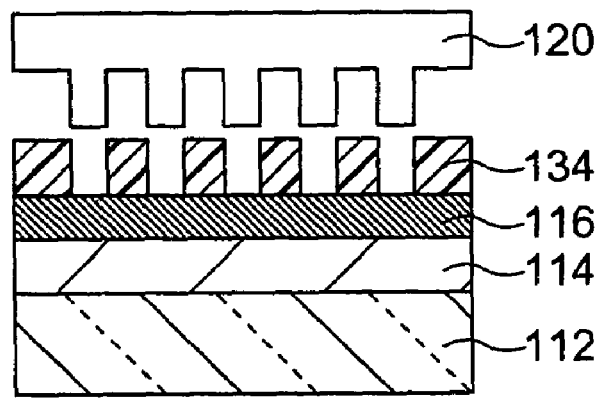
Figure 13C:
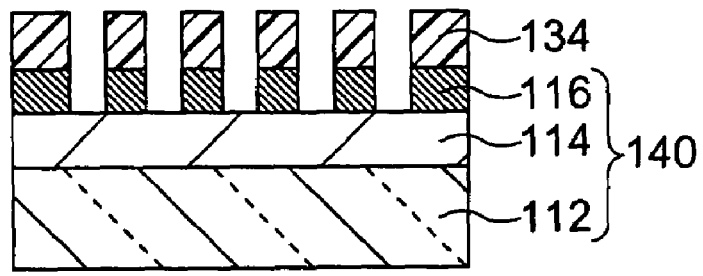

Next, an original disc 130*a* of an imprint stamper was obtained by utilizing the resist layer 132 formed with the concave and convex pattern as a mask and performing etching process on the glass original disc 130 using $CF_4$ gas to transfer the concave and convex pattern on the resist layer 132 on the glass original disc 130 (see FIGS. 12C). At that time, a depth of the convexococave pattern formed on the surface of the original disc 130*a* was about 70 nm.

Figure 12D:
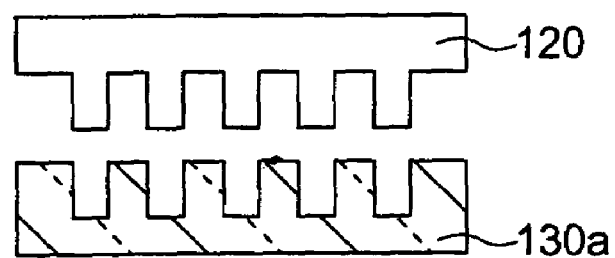

Next, as shown in FIG. 12D, a nickel plating processing was performed on the surface of the original disc 130*a*, and an imprint stamper 120 was obtained. A concave and convex depth of the imprint stamper 120 was about 70 nm.

Next, as shown in FIG. 13A, a magnetic film of a vertical recording type was formed on a glass disc 112 with a radius of 65 mm and a hole (not shown) having an inner diameter of 20 mm by forming a soft magnetic layer 114 made from ruthenium alloy and a recording layer 116 made from cobalt alloy on the glass disc 112 by a sputtering process. Thereafter, a novolac type resist layer 134 with a film thickness of 100 nm was formed on the magnetic film by a spin coating.

Next, as shown in FIG. 13B, a concave and convex shape on a surface of the imprint stamper 120 was transferred on the resist layer 134 formed on the glass disc 112 by pressing the imprint stamper 120 on the glass disc 112 formed with the resist layer 134 with a force of 35 t for one minute using the imprint apparatus according to Example 1 of the present invention. It was confirmed from observation on a surface shape of the resist layer 134 after the concave and convex pattern transfer conducted by using an AFM (atomic force microscope) that a concave and convex pattern with a depth of 70 nm was evenly transferred on the resist layer from an inner periphery to an outer periphery thereof. That is, the concave and convex pattern was transferred on the resist layer 134 such that a portion from which the magnetic material was to be finally removed constituted a recessed structure with a depth of 70 nm. Incidentally, it is preferable that a pressure applied when the imprint stamper transfers a concave and convex pattern is 100 MPa or more.

Next, at least the recording layer 116 was patterned utilizing the resist layer 134 formed with the concave and convex pattern as a mask and using an argon ion milling process (see FIG. 13C). The recording layer 116 was removed from the portion of the resist layer 134 whose surface had a recessed structure by a milling process. On the other hand, a portion of the resist layer 134 whose surface was not recessed was etched by a milling process, but the etching did not reach the recording layer 116 so that the magnetic material remained (see FIG. 13C).

A recording medium 140 having a magnetic material pattern was obtained by performing an oxygen ashing process on the resultant glass disc 112 to remove the remaining resist 134. It was confirmed from observation of the magnetic material pattern on the surface of the recording medium 140 conducted by an AFM that a magnetic material pattern with an even depth was obtained from an inner periphery thereof to an outer periphery thereof.

A magnetic recording medium was obtained by forming a protective film on a surface of the glass disc 112 by a carbon sputtering. The magnetic recording medium operated as a medium which allows recording from the innermost periphery to an outermost periphery thereof.

As explained above, the magnetic recording medium obtained in Example 4 has a structure having reduced variations in concave and convex depth and pattern shape of magnetic material.

As explained above, according to the respective embodiments of the invention, even pattern transfer can be performed with a high throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An imprint apparatus comprising:
a first press plate having a first press face on which a substrate to be transferred with a concave and convex pattern of a portion to be pressed is placed, the portion to be pressed having an imprint stamper formed on a surface thereof with the concave and convex pattern and the substrate;
a second press plate having a second press face opposed to the first press face, which is arranged such that the second press face presses a face of the imprint stamper which is opposed from a face thereof on which the concave and convex pattern is formed;
a pressure applying unit which applies a pressure on a face of the second press plate which is opposed from the second press face;
a first supporting member which supports a face of the first press plate which is opposed from the first press face and has a section equal to or smaller than a bottom face of the substrate in size;
a frame structure which has a second supporting member supporting the first supporting member, a third supporting member supporting the pressure applying unit, and coupling members coupling respective both ends of the second supporting member and the third supporting member;
a bolster which is provided between the second supporting member and the first supporting member;
a first die which is provided between the first supporting member and the first press plate and which is fixed with the first press plate and has a face broader than that of the first press plate;
a second die which is fixed with a face of the second press plate which is opposed from the second press face, and has a face broader than that of the face of the second press plate;
a pressure receiving member whose one end is fixed with a face of the second die which is opposed from the second press plate and whose other end receives a pressure from the pressure applying unit, and which has a section equal to or smaller than a size of a face of the imprint stamper which is opposed from a face of the imprint stamper where the concave and convex pattern is formed;
a guide pin which is provided on one of two opposing faces of the first die and the second die; and
a guide which is provided on the other of the two opposing faces of the first die and the second die and has a hole through which the guide pin slides.

2. An imprint apparatus according to claim 1, wherein the other end of the pressure supporting member is formed in a spherical shape.

3. An imprint apparatus comprising:
a first press plate having a first press face on which a substrate to be transferred with a concave and convex pattern of a portion to be pressed is placed, the portion to be pressed having an imprint stamper formed on a surface thereof with the concave and convex pattern and the substrate;
a second press plate having a second press face opposed to the first press face, which is arranged such that the second press face presses a face of the imprint stamper which is opposed from a face thereof on which the concave and convex pattern is formed;
a pressure applying unit which applies a pressure on a face of the second press plate which is opposed from the second press face;
a first supporting member which supports a face of the first press plate which is opposed from the first press face and has a section equal to or smaller than a bottom face of the substrate in size;
a frame structure which has a second supporting member supporting the first supporting member, a third supporting member supporting the pressure applying unit, and coupling members coupling respective both ends of the second supporting member and the third supporting member,
wherein a first member which has a section equal to or smaller than a bottom face of the substrate and is made from material having a Young's modulus larger than that of the first press plate is embedded in a region of the first press face on which the substrate is placed, and a second member which has a section equal to or smaller than the bottom face of the substrate and is made from material having a Young's modulus larger than that of the second press plate is embedded in a region of the second press face which presses the imprint stamper.

4. An imprint apparatus comprising:
a first press plate having a first press face on which a substrate to be transferred with a concave and convex pattern of a portion to be pressed is placed, the portion to be pressed having an imprint stamper formed on a surface thereof with the concave and convex pattern and the substrate;
a second press plate having a second press face opposed to the first press face, which is arranged such that the second press face presses a face of the imprint stamper which is opposed from a face thereof on which the concave and convex pattern is formed;
a pressure applying unit which applies a pressure on a face of the second press plate which is opposed from the second press face;
a frame structure which has a second supporting member supporting the first press plate, a third supporting member supporting the pressure applying unit, and coupling members coupling respective both ends of the second supporting member and the third supporting member;
a first member which is embedded in a region of the first press face on which the substrate is placed and which has a section equal to or smaller than a bottom face of the substrate and is made from material having a Young's modulus larger than that of the first press plate; and
a second member which is embedded in a region of the second press face which presses the imprint stamper and which has a section equal to or smaller than the bottom face of the substrate and is made from material having a Young's modulus larger than that of the second press plate.

5. An imprint apparatus according to claim 4, wherein the pressure applying unit is provided with a shaft which presses a face of the second press plate which is opposed from the second press face, and the center axis of the shaft runs through the center of the substrate to coincide with the center axis of the first supporting member.

6. An imprint apparatus according to claim 5, wherein
a first die which is provided between the second supporting member and the first press plate and which is fixed with the first press plate and has a face broader than that of the first press plate;

a second die which is fixed with a face of the second press plate which is opposed from the second press face, and has a face broader than the face of the second press plate;

a pressure receiving member whose one end is fixed with a face of the second die which is opposed from the second press plate and whose other end receives a pressure from the pressure applying unit, and which has a section equal to or smaller than a size of a face of the imprint stamper which is opposed from a face of the imprint stamper where the concave and convex pattern is formed;

a guide pin which is provided on one of two opposing faces of the first die and the second die; and a guide which is provided on the other of the two opposing faces of the first die and the second die and has a hole through which the guide pin slides.

7. An imprint apparatus according to claim 4, wherein a first die which is provided between the second supporting member and the first press plate and which is fixed with the first press plate and has a face broader than that of the first press plate;

a second die which is fixed with a face of the second press plate which is opposed from the second press face, and has a face broader than the face of the second press plate;

a pressure receiving member whose one end is fixed with a face of the second die which is opposed from the second press plate and whose other end receives a pressure from the pressure applying unit, and which has a section equal to or smaller than a size of a face of the imprint stamper which is opposed from a face of the imprint stamper where the concave and convex pattern is formed;

a guide pin which is provided on one of two opposing faces of the first die and the second die; and a guide which is provided on the other of the two opposing faces of the first die and the second die and has a hole through which the guide pin slides.

8. An imprint apparatus according to claim 7, wherein the other end of the pressure supporting member is formed in a spherical shape.

9. An imprint apparatus comprising:

a first press plate having a first press face;

a second press plate having a second press face opposed to the first press face;

a pressure applying unit which applies a pressure on a face of the second press plate which is opposed from the second press face;

a first supporting member which supports a face of the first press plate which is opposed from the first press face;

a frame structure which has a second supporting member supporting the first supporting member, a third supporting member supporting the pressure applying unit, and coupling members coupling respective both ends of the second supporting member and the third supporting member; and a plurality of press portions which are provided between the first press face and the second press face, wherein each of the plurality of press portions comprises a third press plate having a third press face on which a substrate to be transferred with a concave and convex pattern of a portion to be pressed is placed, the portion to be pressed having an imprint stamper formed on a surface thereof with the concave and convex pattern and the substrate;

a fourth press plate having a fourth press face opposed to the third press face, which is arranged such that the fourth press face presses a face of the imprint stamper which is opposed from a face thereof on which the concave and convex pattern is formed;

a fourth supporting member which supports a face of the third press plate which is opposed from the third press face and has a section equal to or smaller than a bottom face of the substrate; and a first pressure receiving portion whose one end is fixed on a face of the fourth press plate which is opposed from the fourth press face and whose other end is fixed to the second press face, and which has a section equal to or smaller than a face of the imprint stamper which is opposed from a face thereof on which the concave and convex pattern is formed.

10. An imprint apparatus according to claim 9, wherein the pressure applying unit is provided with a shaft which presses a face of the second press plate which is opposed from the second press face, and the center axis of the shaft coincides with the center axis of the first supporting member.

11. An imprint apparatus according to claim 10, further comprising:

a second pressure receiving member whose one end is fixed to a face of the second press plate which is opposed from the second press face and whose other end receives a pressure from the pressure applying unit, and which has a section having a size equal to that of a section of the first supporting member;

a guide pin which is provided on one of the first and second press faces;

a guide which is provided on the other of the first and second press faces and has a hole through which the guide pin slides.

12. An imprint apparatus according to claim 10, wherein a first member which has a section equal to or smaller than a bottom face of the substrate and is made from material having a Young's modulus larger than that of the third press plate is embedded in a region of the third press face on which the substrate is placed, and a second member which has a section equal to or smaller than a bottom face of the substrate and is made from material having a Young's modulus larger than that of the fourth press plate is embedded in a region of the fourth press face which presses the imprint stamper.

13. An imprint apparatus according to claim 9, further comprising:

a second pressure receiving member whose one end is fixed to a face of the second press plate which is opposed from the second press face and whose other end receives a pressure from the pressure applying unit, and which has a section having a size equal to that of a section of the first supporting member;

a guide pin which is provided on one of the first and second press faces;

a guide which is provided on the other of the first and second press faces and has a hole through which the guide pin slides.

14. An imprint apparatus according to claim 13, wherein the other end of the pressure applying unit is formed in a spherical shape.

15. An imprint apparatus according to claim 9, wherein a first member which has a section equal to or smaller than a bottom face of the substrate and is made from material having a Young's modulus larger than that of the third press plate is embedded in a region of the third press face on which the substrate is placed, and a second member which has a section equal to or smaller than a bottom face of the substrate and is made from material having a Young's modulus larger than that of the fourth press plate is embedded in a region of the fourth press face which presses the imprint stamper.

16. An imprint apparatus according to claim 9, wherein the plurality of press portions are arranged concentrically about the center axis of the first supporting member.

17. An imprint apparatus comprising:
- a first press plate having a first press face on which a substrate to be transferred with a concave and convex pattern of a portion to be pressed is placed, the portion to be pressed having an imprint stamper formed on a surface thereof with the concave and convex pattern and the substrate;
- a second press plate having a second press face opposed to the first press face, which is arranged such that the second press face presses a face of the imprint stamper which is opposed from a face thereof on which the concave and convex pattern is formed;
- a pressure applying unit which applies a pressure on a face of the second press plate which is opposed from the second press face;
- a first supporting member which supports a face of the first press plate which is opposed from the first press face and has a section equal to or smaller than a bottom face of the substrate in size;
- a frame structure which has a second supporting member supporting the first supporting member, a third supporting member supporting the pressure applying unit, and coupling members coupling respective both ends of the second supporting member and the third supporting member;
- a bolster which is provided between the second supporting member and the first supporting member;
- a first die which is provided between the first supporting member and the first press plate and which is fixed with the first press plate and has a face broader than that of the first press plate;
- a second die which is fixed with a face of the second press plate which is opposed from the second press face, and has a face broader than that of the face of the second press plate;
- a pressure receiving member whose one end is fixed with a face of the second die which is opposed from the second press plate and whose other end receives a pressure from the pressure applying unit, and which has a section equal to or smaller than a size of a face of the imprint stamper which is opposed from a face of the imprint stamper where the concave and convex pattern is formed;
- a guide pin which is provided on one of two opposing faces of the first die and the second die; and
- a guide which is provided on the other of the two opposing faces of the first die and the second die and has a hole through which the guide pin slides,
- wherein the pressure applying unit is provided with a shaft which presses a face of the second press plate which is opposed from the second press face, and the center axis of the shaft runs through the center of the substrate to coincide with the center axis of the first supporting member.

* * * * *